(12) United States Patent
Kugel et al.

(10) Patent No.: US 9,384,823 B2
(45) Date of Patent: Jul. 5, 2016

(54) SRAM ARRAY COMPRISING MULTIPLE CELL CORES

(71) Applicant: INTERNATIONAL BUSINESS MACHINES CORPORATION, Armonk, NY (US)

(72) Inventors: Michael Kugel, Boeblingen (DE); Silke Penth, Holzgerlingen (DE); Raphael Polig, Dietikon (CH); Tobias Werner, Weil im Schoenbuch (DE)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/491,222

(22) Filed: Sep. 19, 2014

(65) Prior Publication Data

US 2016/0086659 A1 Mar. 24, 2016

(51) Int. Cl.
*G11C 11/418* (2006.01)

(52) U.S. Cl.
CPC .................................. *G11C 11/418* (2013.01)

(58) Field of Classification Search
None
See application file for complete search history.

(56) References Cited

U.S. PATENT DOCUMENTS

| | | | |
|---|---|---|---|
| 4,429,374 A * | 1/1984 | Tanimura | G11C 8/00 326/108 |
| 5,359,572 A | 10/1994 | Sato et al. | |
| 7,023,747 B2 | 4/2006 | Takahashi | |
| 7,466,620 B2 | 12/2008 | Mohammad et al. | |
| 8,130,588 B2 | 3/2012 | Choi et al. | |
| 8,164,972 B1 | 4/2012 | Su | |
| 2003/0090944 A1 | 5/2003 | Shimizu et al. | |
| 2008/0013376 A1 | 1/2008 | Sim | |
| 2009/0240900 A1 | 9/2009 | Sosogi et al. | |
| 2012/0185664 A1 | 7/2012 | Anvar et al. | |
| 2012/0195152 A1 | 8/2012 | Sung et al. | |

FOREIGN PATENT DOCUMENTS

JP 5034233 B2 9/2012
WO WO2013011848 A1 1/2013

OTHER PUBLICATIONS

Shin, Kinuk Luke et al., "The Next-Generation 64b SPARC Core in a T4 SoC Processor," 2012 IEEE International Solid-State Circuits Conference, Feb. 2012, pp. 60-62.
Meinerzhagen, P. et al., "Towards Generic Low-Power Area-Efficient Standard Cell Based Memory Architecture," 53rd IEEE International Midwest Symposium on Circuits and Systems, Aug. 2010, 2 pages (abstract only).
Search Report under Section 17(5) for GB1306122.1 dated Aug. 16, 2013, 4 pages.

* cited by examiner

*Primary Examiner* — James G Norman
(74) *Attorney, Agent, or Firm* — Margaret McNamara, Esq.; Blanche E. Schiller, Esq.; Heslin, Rothenberg Farley & Mesiti P.C.

(57) ABSTRACT

An SRAM array having multiple cell cores to store and retrieve data. A cell core includes a plurality of SRAM cells, and at least two corresponding cell cores build a cell core row. A word decoder is configured to decode incoming address signals. The word decoder includes a cell core select unit configured to generate a cell core row select signal from a combination of a first part of the incoming address signals and a received clock signal.

18 Claims, 7 Drawing Sheets

SRAM ARRAY COMPRISING MULTIPLE CELL CORES

BACKGROUND

One or more aspects relate, in general, to memory, and in particular, to static random access memory (SRAM).

Static random access memory cells are currently used in many application scenarios to store data. Speed of access is one parameter for such SRAM cells. When designing a multi-Gigahertz (GHz) SRAM, power consumption is one consideration without sacrificing performance in terms of frequency, width, i.e., word size, and depth, i.e., word count.

A strong contributor to power consumption is a word decoder that allows access to single words based on an incoming word address. The word decoder decodes a binary address into single word lines.

Physically, SRAMs usually get partitioned into multiple SRAM cell core regions to cope with the physical wiring length of the word lines as well as with the physical wiring length of the bit lines on the memory chip. Bit lines are used to read-out stored data and write data into the SRAM cells. Both may not exceed a certain physical length due to physical implications.

Today's decoders will send all their pre-decoded signals to the last decoding stage, in particular a word line driver, located at each core region. This means that all pre-decoded signals may be toggling at all word line drivers even if only one of them may be activated. Typically, this may result in unnecessary power consumption.

As power density increases with each CMOS (complementary metal-oxide semiconductor) technology node and logic demands for larger high frequency SRAMs continue to grow, this decoding scheme may no longer be suitable. It may result in reliability issues due to power supply, lifetime problems because of electro migration and performance impacts due to the high amount of capacitance (load) required to drive the lines.

There are several disclosures related to an SRAM array comprising multiple cell cores.

U.S. Pat. No. 8,130,588A1, incorporated herein by reference in its entirety, discloses a semiconductor memory device including a memory cell array arranged in rows and columns, a row decoder and a control circuit. The control circuit generates the internal clock signal so that the row decoder does not operate for a predetermined time in response to the chip select signal.

US 2012/0285664A1, incorporated herein by reference in its entirety, discloses a system and method for adjusting timing of memory access operations to a memory block. A controller may be adapted to adjust timing of a memory access operation to the memory block by extending a portion of a clock pulse to compensate for delay associated with the memory block.

BRIEF SUMMARY

Shortcomings of the prior art are overcome and additional advantages are provided through the provision of a static random access memory (SRAM) array. The static random access memory array includes, for instance, multiple cell cores to store and retrieve data, wherein a cell core comprises a plurality of SRAM cells, and wherein at least two corresponding cell cores build a cell core row; a word decoder configured to decode one or more incoming address signals representing a storage address into a single word line, wherein one storage word is activated, the word decoder including, for instance, a cell core select unit configured to generate a cell core row select signal from a combination of a first part of the one or more incoming address signals and a received clock signal; and a decoding element for each cell core row, the decoding element including: a first decoding block for decoding a second part of the one or more incoming address signals for building an upper portion of one or more word line select signals and a second decoding block for decoding a third part of the one or more incoming address signals for building a lower portion of the one or more word line select signals; and a word line driver for each cell core row configured to combine the upper portion of a word line select signal from the first decoding block and the lower portion of a word line select signal from the second decoding block to form a unique word line signal per storage address.

Methods and computer program products relating to one or more aspects are also described and claimed herein.

Additional features and advantages are realized through the techniques described herein. Other embodiments and aspects are described in detail herein and are considered a part of the claimed aspects.

BRIEF DESCRIPTION OF THE SEVERAL VIEWS OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
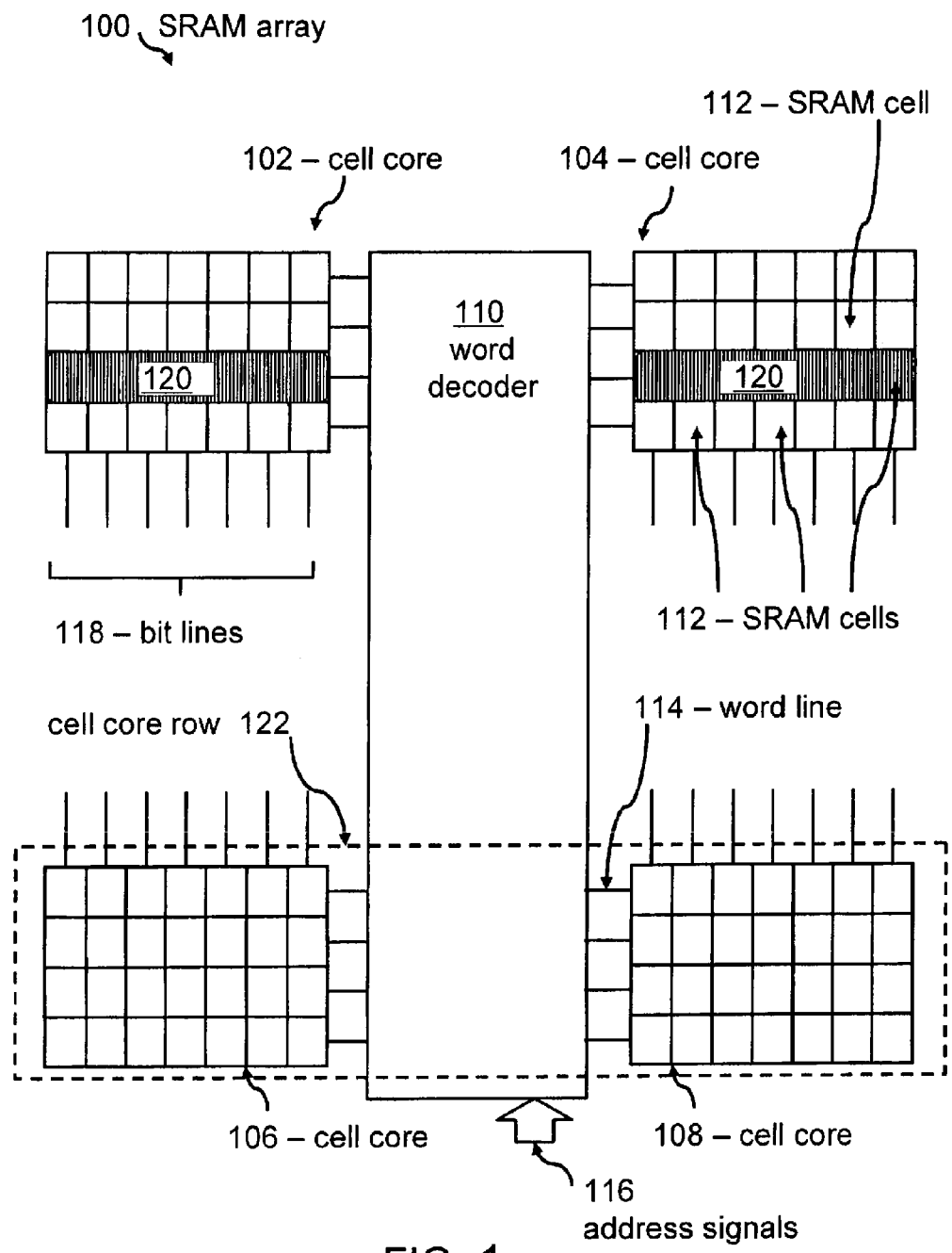
FIG. 1 shows one example of a block diagram of an embodiment of a SRAM array, in accordance with one or more aspects.

In the context of this description, the following conventions, terms and/or expressions may be used:

The term "SRAM array" may denote an array of static random access memory cells. The array may be organized in sub-arrays which may, in one embodiment, only comprise subgroups of SRAM cells organized in rows and columns. Such a subgroup may denote a cell core. Such cell cores of SRAM cells may also be organized in rows and columns. Thus, several cell cores may build a "cell core row".

The term "store and retrieve data" may denote writing data in memory cells and reading the once stored information as it may be known by a skilled person.

A "storage word" may be a combination of a series of bits organized as one storage word for a combined access to all bits of such storage word. Typical storage word lengths may be equal to the power of 2. However, modern computing chips may have any storage word length.

The term "word decoder" may denote an electronic circuit adapted to select individual storage words. Once a storage word may have been selected, information may be written into the word or read from the storage word. In order to select a storage word, the word decoder uses input signals in the form of address signals.

The term "address signals" may denote a combination of signals on different physical lines to uniquely identify a memory cell. Each signal combination on the address lines may be decodable into a single storage word address or storage address.

The term "bit line" may denote a line combining input ("write") and output ("read") signals from corresponding bits of different storage bits in a storage word. However, if only one word may be addressed at a time, the bit lines may have the logical statuses of the bits of the addressed storage word. The same number of bit lines may be required as the word may have bits in order to read out or write to a storage word. The bits per word may be spread over several cell cores.

In contrast, the term "word line" may denote a line required to activate all cells of a storage word for access, i.e., read or write.

The term "storage word" may denote a series of storage bits building one storage word.

The term "cell core select unit" may denote an electronic circuit adapted to activate individual cell cores. It may be required to activate several cell cores of SRAM sub-arrays in order to activate a complete storage word.

The term "cell core row select signal" may denote a signal adapted to activate all cell cores building one cell core row. Typically, all cell cores of such a cell core row may be required in order to read a storage word.

The term "first part of incoming address signals" may denote one portion of incoming address signals. In one example, the most significant bit or bits may be used as the first part.

The term "clock signal" may denote a clock signal available as part of a computer system, computer subsystem or individual chip, in particular a memory chip like an SRAM array. However, individual components may have different clock speeds. Here, the clock signal may denote the clock signal available for the SRAM array.

The term "decoding element" may denote a sub-part of the word decoder adapted to address a cell core row of SRAM cells. There may be several decoding elements as part of the word decoder for different cell core rows.

The term "word line driver" may denote a driver for selecting a line addressing and activating a single word for a read or write operation. The word line driver may activate a line carrying a word line select signal.

The term "most significant bits" (MSBs) may denote the higher order bits of parallel organized words, or addresses, or lines.

The term "least significant bits" (LSBs) may denote the lower order bits of parallel words, or addresses, or lines.

The term "half word select signal" may denote a select signal which may not select a complete word with its full word length, but only a part of the bits of a word. This may be a half word comprising only 50% of the bits of a word or only the lower or the upper portion of a storage word. The half word select signal may be used to activate only one cell core or a subset of the cell cores of a cell core row. In particular, also smaller portions of a word—e.g., a quarter word or other portions of a storage word—may be selectable under a strict power regime, meaning that even more power may be saved within the SRAM array.

One or more aspects may eliminate a problem of excessively high power consumption of SRAM arrays operating at very high frequencies. This may be achieved by a pre-decoding of a core select signal from the input address and a combination of it with a clock signal of the word decoder. This newly built cell core row select signal may, in one embodiment, only be active for the accessed core region, being built out of one or more cell cores. It may be sent to a first stage of pre-decoders and may activate, in one embodiment, only the set necessary to access the desired core region. This may reduce the amount of power required without affecting the access time to launch a word line. One or more aspects may also, in one embodiment, only activate cell cores comprising portions of a word, e.g., the upper part or the lower part of the word if a word may be split into two cell cores.

It may be clear that the cell core row select signal may at the same time be the clock signal for individual and active portions of the decoder. Those areas of the decoder not required for decoding a specific address may not receive the modified clock signal at all. Without a clock signal, that individual portion of the decoder may not be active and thus, not require any power or much less power than with a clock signal. So, with the modified clock signal, no additional wiring and/or signal generation may be required in order to put the individual portions of the decoder into a sort of sleep mode. In one embodiment, only the active portions required to decode the address signals may receive a clock signal—i.e. the cell core row select signal—and be active.

According to one embodiment of the SRAM array, word-wide organized data may be stored in two related cell cores building the cell core row, such that one portion of the word-wide organized data is stored in storage cells of a first cell core of the cell core row and the remaining portion of the word-wide organized data may be stored in a storage cell of a corresponding second cell core of the cell core row. Thus, the word to be stored may be split into two parts/halves, wherein each part of the storage word may be stored in one of the two cell cores. This may allow shorter word lines per driver, thus less required charge per word line and consequently less power consumption.

According to one embodiment of the SRAM array, the one portion of the word-wide organized data and the remaining portion of the word-wide organized data may be equal in size. This may be a natural split of a word into different cell cores. However, more cell cores per word may be possible.

According to an alternative embodiment of the SRAM array, the word-wide organized data may be stored in four corresponding cell cores building a cell core row, such that a first portion of the word-wide organized data may be stored in a first cell core of the cell core row, a second portion of the word-wide organized data may be stored in a second cell core of the cell core row, a third portion of the word-wide organized data may be stored in a third cell core of the cell core row and the remaining portion of the word-wide organized data may be stored in a fourth cell core of the cell core row. Thus, a storage word may be split into four parts. Each part of the word may be stored in a different cell core. A skilled person may understand that more cell cores per word may be implemented.

According to a further embodiment of the SRAM, the most significant bits of the word-wide organized data may be stored in the first cell core and the least significant bits of the word-wide organized data may be stored in the second cell core. In an alternative configuration, a storage word may be spread over four or more cell cores which may require organizing the split of the word in an equivalent way. Thus, storage words may be spread across different cell cores keeping required wiring physically short. This may require less charge to activate the related lines. Thus, additional energy or power may be saved.

According to one additional embodiment of the SRAM array, the combining of the upper portion and the lower portion of the word line select signal to form a unique word line signal per storage address may comprise combining pair-wise one upper portion signal from the first decoding block and one lower portion signal from the second decoding block. This technique has been proven to be an efficient way to generate signals for the word lines. A driver for each word line may also be included in the electronic combination circuitry of the upper and lower portion signals.

According to another embodiment of the SRAM array, the word decoder may be adapted to address more than two cell core rows. Thus, a more advanced SRAM array may be built comprising more storage cells allowing an increase in the storage capacity, and at the same time, contributing to power savings for the SRAM array.

In one embodiment of the SRAM array, the word line driver may comprise separate units for decoding the output signals from the first decoding block and the second decoding block and for driving the word lines. This way different chip technologies may be used for the different components. One component may be optimized for low power consumption and speed and the other part may be optimized for maximum output to drive the word lines.

According to a further embodiment of the SRAM array, the cell core select unit may be configured to receive a half word select signal and selectively activate only one of the cell cores of a cell core row. In case a cell core row comprises two cell cores, a half-word may be selected. In this case, the other cell core may not be activated at all saving even more power. In case there may be more than two core cells per cell core row, also quarter words or even smaller parts of a storage word may be selected. Typically, the number of cell cores per cell core row and the number of sub-parts of a storage word may correspond to each other.

It should also be noted that embodiments of the invention have been described with reference to different subject-matters. For example, some embodiments have been described with reference to method type claims, whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, e.g., between features of the method type claims, and features of the apparatus type claims, is considered as to be disclosed within this document.

The aspects defined above and further aspects of the present invention are apparent from the examples of embodiments to be described hereinafter and are explained with reference to the examples of embodiments, but to which the invention is not limited.

In the following, a detailed description of the figures will be given. All instructions in the figures are schematic. Firstly, a block diagram of an embodiment of an SRAM array, in accordance with one or more aspects, comprising multiple cell cores is given. At the end, an embodiment of a method for operating an SRAM array is described.

FIG. 1 shows a block diagram of an embodiment of an SRAM array, in accordance with one or more aspects. The SRAM array 100 may comprise a plurality of SRAM cell cores 102, 104, 106, 108 comprising a plurality of SRAM cells 112. For instance, all SRAM cells in one horizontal line may define a word in the memory defined by the SRAM array in which data words composed out of data bits may be stored and retrieved. Consequently, the at least two corresponding cell cores 102, 104 or 106, 108 may build a cell core row 122. The SRAM cells 112 of one memory word 120 may be addressed by a word line which may activate all SRAM cells 112 belonging to one word. Once activated, these SRAM cells may signal their status on the bit lines 118. It may be noted that a reference numeral for the bit lines is only shown for cell core 102. A skilled person will understand that also the other cell cores may have corresponding bit lines.

A word decoder 110 may be configured to decode incoming address signals 116—representing a storage address—into a single word line 114 so that one storage or memory word may be activated or selected or addressed.

Figure 2:
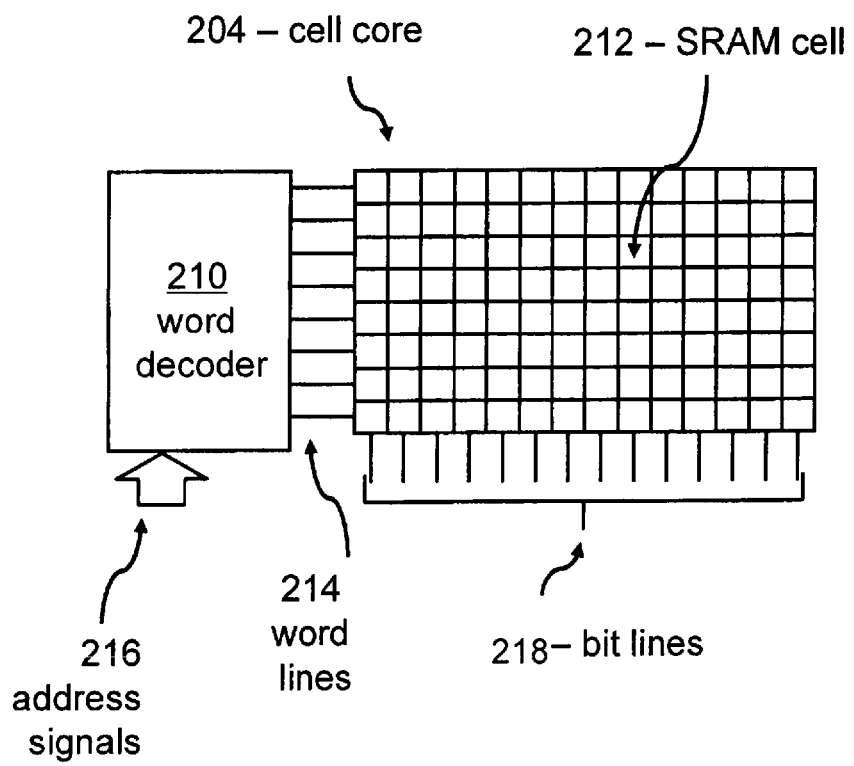
FIG. 2 shows one example of a block diagram of a word decoder.

FIG. 2 shows a block diagram of a word decoder 210. The incoming address signals 216 may be decoded by decoder elements of word decoder 210. Each address line combination may be translated to a single word line 214. The SRAM cells 212 in a cell core 204, which may belong to a storage word, may be selected or activated by the word line 214. Once activated, the data may be read from, or written to, the individual SRAM cells of the word via the bit lines 218.

Figure 3:
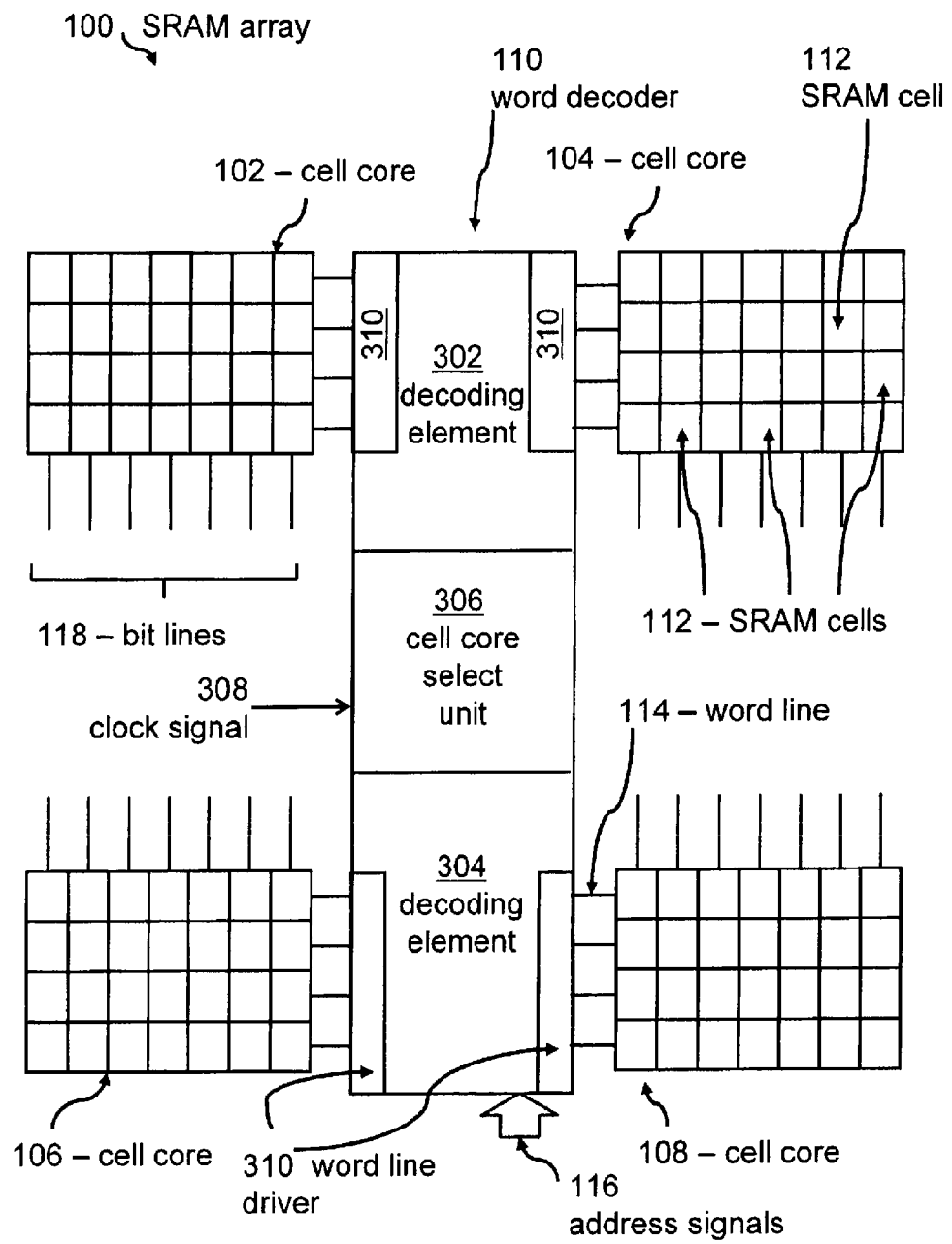
FIG. 3 shows one example of a block diagram of an embodiment of the SRAM array in more detail.

FIG. 3 shows a block diagram of an embodiment of the SRAM array in more detail. Firstly, the word decoder 110 may comprise a cell core select unit 306. The address signals 116 may be fed to the cell core select unit. It should be clear that a specific storage word may either be locatable in one of the two cell core rows being built by either cell cores 102 and 104, or cell cores 106 and 108. The task of the cell core select unit 306 may, in one embodiment, only activate those cell cores that are relevant for activating the selected storage word. The other cell cores may not be selected. Thus, the corresponding decoding elements may not be active at all. The cell core select unit 306 may function as a pre-selection for activating relevant decoding elements 302 or 304. If, e.g., a storage word may be addressable by a word line related to the cell cores 102 and 104, the decoding element 304 may stay inactive. This may have the advantage to save energy and operate the SRAM array more effectively. The same may apply for the word line drivers 310. Only those word line drivers may be activated that may be relevant for activating the selected/addressed storage word. This is beneficial because the word line may be pretty long, and thus, may require a lot of charge to activate the physically long wire to reach the last SRAM cell belonging to the storage word to be addressed.

Hence, the cell core select unit 306 may be configured to generate a cell core row select signal (cf., FIG. 4) from a combination of a first part of the incoming address signals 116 and a received clock signal 308. The clock signal 308 may also be fed to the cell core select unit 306.

Figure 4:
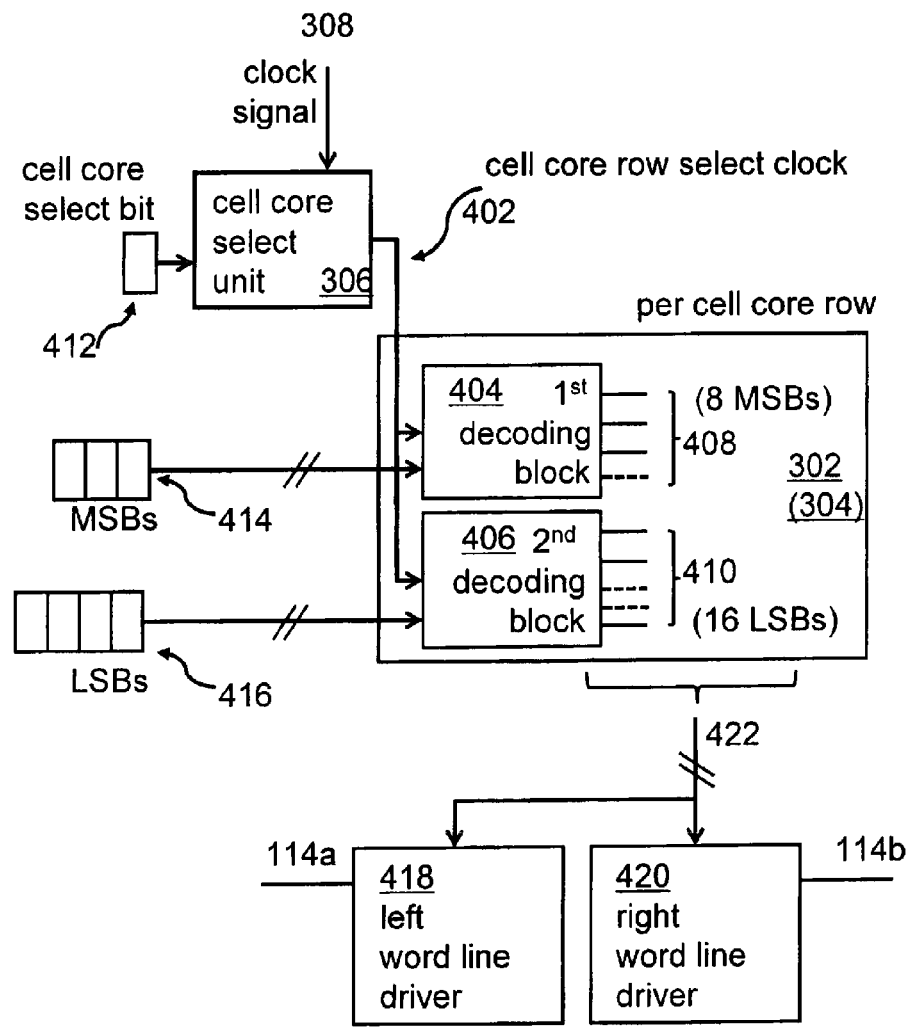
FIG. 4 shows one example of a block diagram of an embodiment of elements of the pre-decoding units.

FIG. 4 shows a block diagram of an embodiment of elements of the decoding elements 302, 304 of FIG. 3, respectively. There may be one decoding element for each cell core row (exemplarily shown only for one cell core row 122 in FIG. 1). Each decoding element 302, 304 of FIG. 3 may comprise a first decoding block 404 for decoding a second part 414, in particular an MSB part from the first part of the incoming address signals 116 for building an upper portion 408, in particular an MSB portion, of word line select signals 422. Each decoding element 302, 304 of FIG. 3 may also comprise a second decoding block 406 for decoding a third part 416, in particular an LSB part, of the incoming address signals 116 for building a lower portion 410, in particular an LSB portion of word line select signals 422. A first part 412 of the address signals, in particular the primary MSB 412 or bits, may be used as input signal for the cell core select unit 306. This bit, respectively these bits, may also be called "cell core select bit". As second input, the cell core select unit 306 may receive the clock signal 308 of the SRAM array. Out of these two signals 412 and 308, a cell core row select clock 402 may be generated. FIG. 4 shows only one cell core row select clock line 402. For more cell cores, multiple lines 402 may be used.

It may be understood that each cell core row may have its own cell core row select clock line which actually may also be referred to as pre-decoding clock. Thus, in one embodiment, only those cell core rows may receive a cell core row select clock line 402 that may be activated to activate a specific word line addressed by the incoming address signals 116.

The word line select signals 422 may then be logically combined to build a word line that may be specific for a unique storage word. This may be referred to as 'last stage decoding'. Finally, a word line driver 418, 420 may function as an amplifier of the signals 422 to drive the word lines 114 for the right and the left cell core 102, 104 (cf. FIG. 3) of the SRAM array 100.

The word line driver 418, 420 for each cell core row may be configured to combine the upper portion 408 of the word line select signal 422 from the first decoding block 404 and the lower portion 410 of the word line select signal 422 from the second decoding block 406 to form a word-wide unique word line signals 114a, 114b per storage word address. In particular, the word line driver 418, 420 may each be configured for decoding and driving the word lines 114 in a combined function. In another embodiment, these two functions may be separated. It may also be clear that for power saving reasons for an addressed half word only one of the two word line drivers 418 or 420 may be activated. The cell core row select clock signal 402 may be repurposed for this.

As the example shows, there are eight address bits: 412, 414, 416. The MSB may be used from—together with the clock signal 308—the cell core row select signal or clock 402. The other three MSBs 414 may be used to decode eight address lines 408. The remaining four LSBs 416 may be used to decode 16 address lines 410. To decode the "real" word line 114a and 114b, a combination of the lines 408 and 410 may be built such that one line from each group 408 and 410 may logically be combined.

Figure 5:
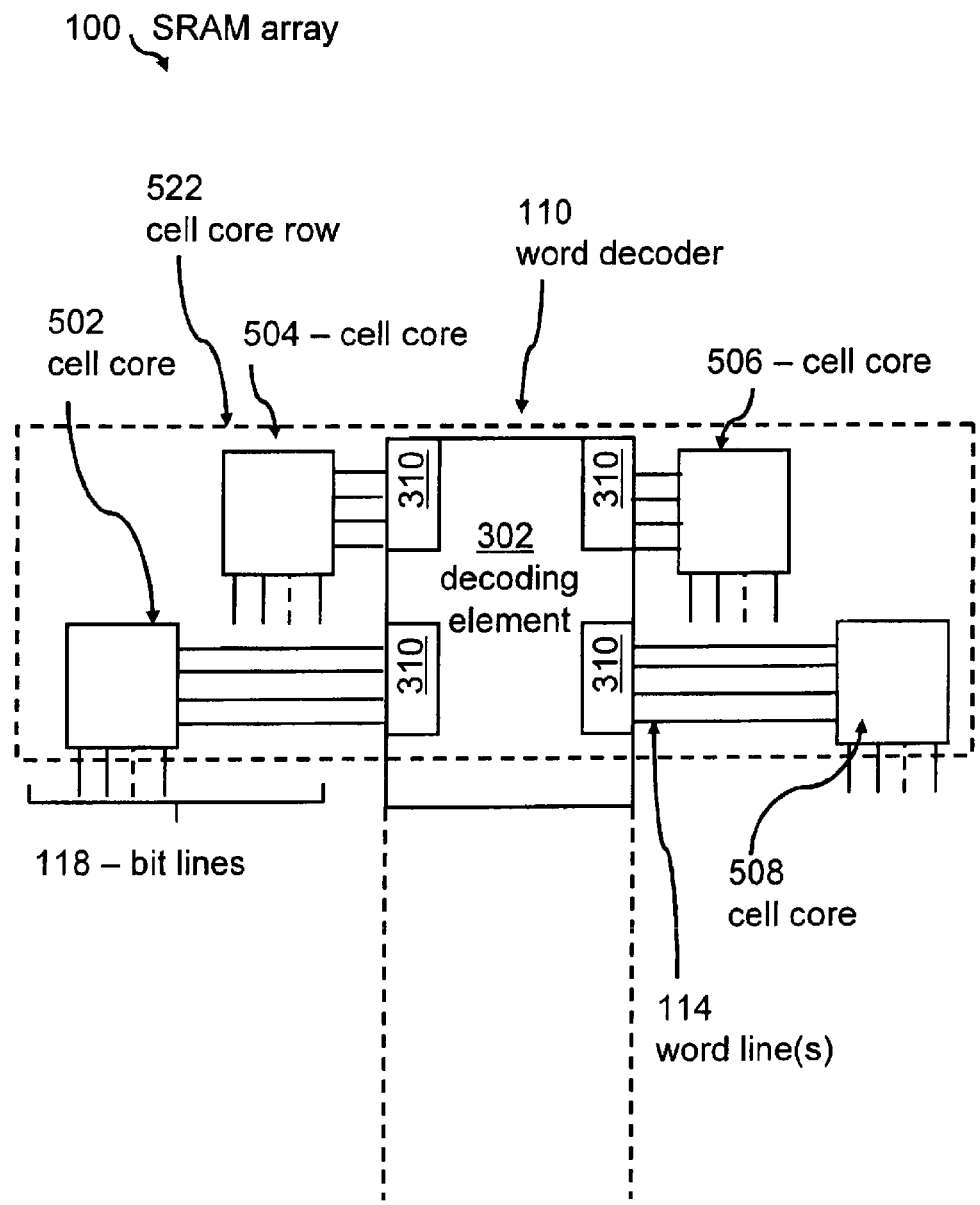
FIG. 5 shows one example of a block diagram of an embodiment of a part of the cell core select unit with a plurality of cell cores.

FIG. 5 shows a block diagram of an embodiment of a part of the cell core select unit with a plurality of cell cores. Here, four cores 502, 504, 506, 508 may be configured for the decoding element 302 as part of the word decoder 110. The storage words may not be split in two parts as in FIGS. 1 and 3, but in 4 parts building a cell core row 522. In one example of a split, a storage word may be divided in 4 equally large sub storage words. Each part may be stored in one core cell 502, 504, 506, 508. Each core cell may have an associated word line driver 310. The data-in and data-out into/out-of the individual SRAM cells may be organized via bit lines 118, as described above. Such architecture may have the advantage that the individual word line may be physically smaller and may thus require less charge, and thus less power, for activation. The overall SRAM array may require less energy to be operated. It may be noted that in FIG. 5 only one word line 114 may be shown exemplarily with a reference numeral.

A skilled person may understand that a storage word may be split across even more cell cores, e.g., six or eight, or even more.

A split of a storage word into, e.g., two parts may have another advantage: It may be possible to address only half storage words. A special signal "half word select signal", fed to the decoding element from either the cell core select unit or from another side, may activate only half a decoding element, i.e., one decoding block and related word line drivers. This way, the power consumption of the SRAM array may further be reduced. Such architecture may be advantageous if, e.g., ASCII (American Standard Code for Information Interchange) text may be stored in long or very long storage words. In that case, single characters may be activated as a partial storage word.

Figure 6:
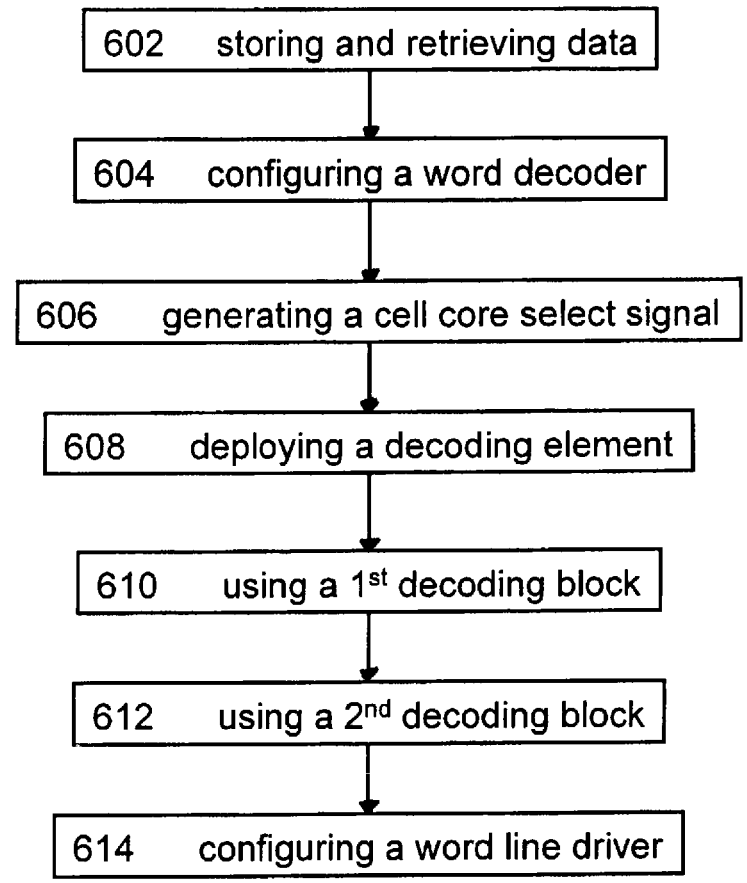
FIG. 6 shows one example of an embodiment of a method for operating an SRAM array.

FIG. 6 shows an embodiment 600 of a method for operating an SRAM array. The method 600 may comprise storing and retrieving 602 data using multiple cell cores. Each cell core may comprise a plurality of SRAM cells. At least two corresponding cell cores may build a cell core row, as described above.

The method may also comprise configuring 604 a word decoder to decode incoming address signals representing a storage address into a single word line, so that one storage word may be activated.

The word decoder may be adapted for generating 606 a cell core row select signal using a cell core select unit from a combination of a first part of the incoming address signals and a received clock signal, as well as deploying 608 a decoding element for each cell core row.

The decoding element may be adapted for using 610 a first decoding block for decoding a second part of the incoming address signals for building an upper portion of word line select signals. Furthermore, the decoding element may be adapted for using 612 a second decoding block for decoding a third part of the incoming address signals for building a lower portion of word line select signals.

In addition, the method may comprise configuring 614 a word line driver for each cell core row in order to combine the upper portion of the word line select signal from the first decoding block and the lower portion of the word line select signal from the second decoding block to form a unique word line signal per storage address.

While the invention has been described with respect to a limited number of embodiments, those skilled in the art, having benefit of this disclosure, will appreciate that other embodiments may be devised, which do not depart from the scope of the invention, as disclosed herein. Accordingly, the scope of the invention should be limited only by the attached claims. Also, elements described in association with different embodiments may be combined. It should also be noted that reference signs in the claims, if any, should not be construed as limiting elements.

As described herein, according to one embodiment, an SRAM array comprising multiple cell cores may be provided. The multiple cell cores may be used to store and retrieve data. Each cell core may comprise a plurality of SRAM cells, wherein at least two corresponding cell cores may build a cell core row. A word decoder may be configured to decode incoming address signals—which may represent a storage address—into a single word line so that one storage word may be activated.

The word decoder may comprise a cell core select unit which may be configured to generate a cell core row select signal from a combination of a first part, in particular the MSB (most significant bit) of the incoming address signals and a received clock signal. A decoding element for each cell core row may comprise a first decoding block for decoding a second part—in particular MSBs from the first part of the address—of the incoming address signals for building an upper portion—in particular, an MSB part—of word line select signals—in particular the MSB portion—and a second decoding block for decoding a third part—in particular the least significant bits (LSB)—of the incoming address signals for building a lower portion—in particular the LSB portion— of word line select signals. In particular, both portions may not have to be equal in data signal line numbers.

A word line driver for each cell core row as part of the word decoder may be configured to combine the upper portion of the word line select signal from the first decoding block and the lower portion of the word line select signal from the second decoding block to form a unique word line signal per storage address—in particular, the word line driver may "decode and drive" the word lines in a combined function.

According to another embodiment, a method for operating an SRAM array may be provided. The method may comprise storing and retrieving data using multiple cell cores, wherein each cell core may comprise a plurality of SRAM cells. At least two corresponding cell cores may build a cell core row. The method may also comprise configuring a word decoder to decode incoming address signals representing a storage address into a single word line so that one storage word may be activated.

The word decoder may comprise generating a cell core row select signal using a cell core select unit from a combination of a first part of the incoming address signals and a received clock signal.

The method may further comprise deploying a decoding element for each cell core row. The decoding element may comprise using a first decoding block for decoding a second part of the incoming address signals for building an upper portion of word line select signals and using a second decoding block for decoding a third part of the incoming address signals for building a lower upper portion of word line select signals.

Furthermore, the method may comprise configuring a word line driver for each cell core row to combine the upper portion of the word line select signal from the first decoding block and the lower portion of the word line select signal from the second decoding block to form a unique word line signal per unique storage address.

In a further embodiment, a method may be provided, in which the method comprises, for instance, storing and retrieving data using multiple cell cores, wherein each cell core may comprise a plurality of SRAM cells. At least two corresponding cell cores may build a cell core row. The method may also comprise decoding incoming address signals representing a storage address into a single word line so that one storage word may be activated. Further, the decoding may comprise generating a cell core row select signal using a cell core select unit from a combination of a first part of the incoming address signals and a received clock signal, using a first decoding block for decoding a second part of the incoming address signals for building an upper portion of word line select signals, and using a second decoding block for decoding a third part of the incoming address signals for building a lower portion of word line select signals. Furthermore, the decoding may comprise combining the upper portion of the word line select signal from the first decoding block and the lower portion of the word line select signal from the second decoding block to form a unique word line signal per unique storage address.

In yet a further embodiment, a computer program product for operating an SRAM array is provided. The computer program product includes a computer readable storage medium readable by a processing circuit and storing instructions for execution by the processing circuit for performing a method. The method includes, for instance, storing and retrieving data using multiple cell cores, wherein a cell core comprises a plurality of SRAM cells, and wherein at least two corresponding cell cores build a cell core row; decoding one or more incoming address signals representing a storage address into a single word line so that one storage word is activated, the decoding including: generating a cell core row select signal from a combination of a first part of the one or more incoming address signals and a received clock signal; using a first decoding block for decoding a second part of the one or more incoming address signals for building an upper portion of one or more word line select signals and using a second decoding block for decoding a third part of the one or more incoming address signals for building a lower portion of the one or more word line select signals; and combining the upper portion of a word line select signal from the first decoding block and the lower portion of a word line select signal from the second decoding block to form a unique word line signal per storage address.

In one or more aspects, speed issues of SRAM cells combined with power consumption limitations are overcome. An increased lifetime of SRAM cells having even high GHz SRAM cells requiring less power are provided.

As will be appreciated by one skilled in the art, aspects of the present disclosure may be embodied as a system, method or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

One or more of the capabilities of embodiments can be implemented in software, firmware, hardware, or some combination thereof. Further, one or more of the capabilities can be emulated.

Figure 7:
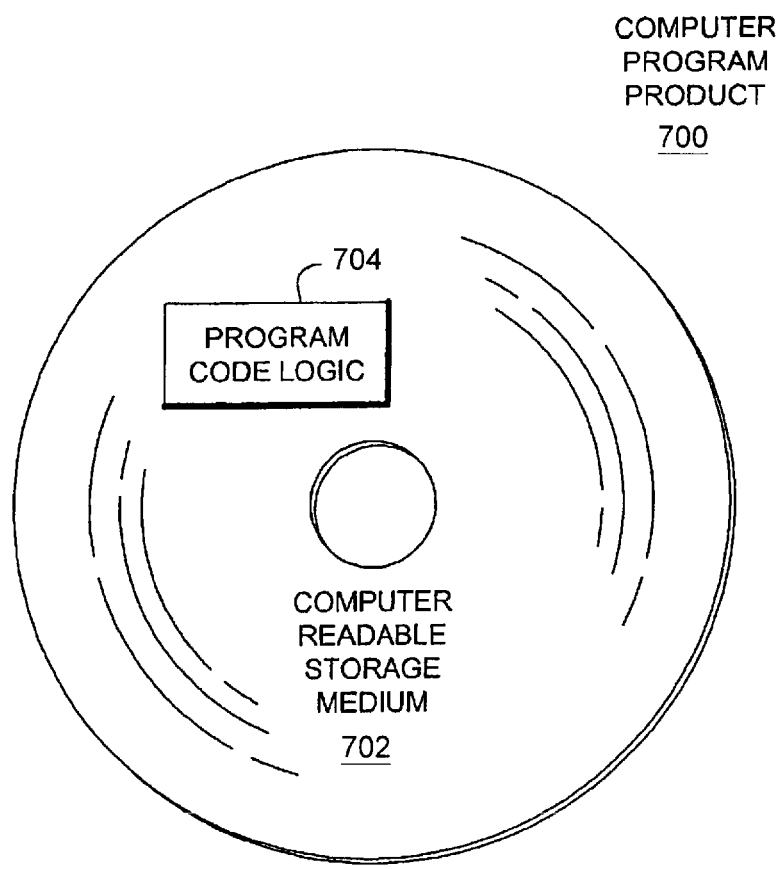
FIG. 7 depicts one embodiment of a computer program product incorporating one or more aspects.

Referring to FIG. 7, in one example, a computer program product 700 includes, for instance, one or more non-transitory computer readable storage media 702 to store computer readable program code means, logic and/or instructions 704 thereon to provide and facilitate one or more embodiments.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to limit of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or steps plus function elements in the claims below, if any, are intended to include any structure, material, or act for performing the function in combination with other claimed elements, as specifically claimed. The description of aspects of the present invention has been presented for purposes of illustration and description, but is not intended to be exhaustive or limited to the invention in the form disclosed. Many modifications and variations will be apparent to those of ordinary skills in the art without departing from the scope and spirit of the invention. The embodiment was chosen and described in order to best explain the principles of the aspects of invention and the practical application, and to enable others of ordinary skills in the art to understand the invention for various embodiments with various modifications, as are suited to the particular use contemplated.

What is claimed is:

1. A static random access memory (SRAM) array comprising:
    multiple cell cores to store and retrieve word-wide organized data, wherein a cell core comprises a plurality of SRAM cells, and wherein at least two corresponding cell cores build a cell core row of the SRAM array, the SRAM array including at least two cell core rows, wherein the cell core row is configured to hold multiple storage words;

a word decoder configured to decode one or more incoming address signals representing a storage address into a single word line, wherein one storage word uniquely identified by the single word line is activated within the cell core row, the word decoder comprising:
  a cell core select unit configured to generate a cell core row select signal activating a decoding element uniquely corresponding to the cell core row based on input of a first part of the one or more incoming address signals and a received clock signal;
  at least two decoding elements, each decoding element of the at least two decoding elements corresponding to a respective cell core row of the at least two cell core rows and comprising:
    a first decoding block for receiving and decoding a second part of the one or more incoming address signals for building an upper portion of one or more word line select signals and a second decoding block for receiving and decoding a third part of the one or more incoming address signals for building a lower portion of the one or more word line select signals; and
  a respective word line driver for each cell core row of the at least two cell core rows, configured to combine the upper portion of a word line select signal, of the one or more word line select signals, from the first decoding block of the decoding element corresponding to the cell core row and the lower portion of the word line select signal from the second decoding block of the decoding element corresponding to the cell core row to form a unique word line signal per storage address.

2. The SRAM array of claim 1, wherein the word-wide organized data are stored in two related cell cores building the cell core row, wherein one portion of the word-wide organized data is stored in a first cell core of the cell core row and a remaining portion of the word-wide organized data is stored in a corresponding second cell core of the cell core row.

3. The SRAM array of claim 2, wherein the one portion of the word-wide organized data and the remaining portion of the word-wide organized data are equal in size.

4. The SRAM array of claim 2, wherein most significant bits of the word-wide organized data are stored in the first cell core and least significant bits of the word-wide organized data are stored in the second cell core.

5. The SRAM array of claim 1, wherein the word-wide organized data are stored in four corresponding cell cores building the cell core row, wherein a first portion of the word-wide organized data is stored in a first cell core of the cell core row, a second portion of the word-wide organized data is stored in a second cell core of the cell core row, a third portion of the word-wide organized data is stored in a third cell core of the cell core row and a remaining portion of the word-wide organized data is stored in a fourth cell core of the cell core row.

6. The SRAM array of claim 1, wherein the combining the upper portion and lower portion of the word line select signal to form the unique word line signal per storage address comprises combining pair-wise one upper portion signal from the first decoding block and one lower portion signal from the second decoding block.

7. The SRAM array of claim 1, wherein the word line driver comprises separate units for decoding output signals from the first decoding block and the second decoding block and for driving word lines.

8. The SRAM array of claim 1, wherein the cell core select unit is configured to receive a half word select signal and selectively activate only one of the cell cores of the cell core row.

9. A method of operating a static random access memory (SRAM) array, the method comprising:
  storing and retrieving word-wide organized data using multiple cell cores, wherein a cell core comprises a plurality of SRAM cells, and wherein at least two corresponding cell cores build a cell core row of the SRAM array, the SRAM array including at least two cell core rows, wherein the cell core row is configured to hold multiple storage words;
  configuring a word decoder to decode one or more incoming address signals representing a storage address into a single word line so that one storage word uniquely identified by the single word line is activated within the cell core row, the word decoder:
    generating using a cell core select unit, a cell core row select signal activating a decoding element uniquely corresponding to the cell core row based on input of a first part of the one or more incoming address signals and a received clock signal;
    deploying at least two a decoding elements, each decoding element of the at least two decoding elements corresponding to a respective cell core row of the at least two cell core rows and performing:
      using a first decoding block for receiving and decoding a second part of the one or more incoming address signals for building an upper portion of one or more word line select signals and using a second decoding block for receiving and decoding a third part of the one or more incoming address signals for building a lower portion of one or more word line select signals; and
    configuring a respective word line driver for each cell core row of the at least two cell core rows to combine the upper portion of a word line select signal, of the one or more word line select signals, from the first decoding block of the decoding element corresponding to the cell core row and the lower portion of the word line select signal from the second decoding block of the decoding element corresponding to the cell core row to form a unique word line signal per storage address.

10. The method of claim 9, wherein the word-wide organized data are stored in two related cell cores building the cell core row, wherein one portion of the word-wide organized data is stored in a first cell core of the cell core row and a remaining portion of the word-wide organized data is stored in a corresponding second cell core of the cell core row.

11. The method of claim 9, wherein the word-wide organized data are stored in four corresponding cell cores building the cell core row, wherein a first portion of the word-wide organized data is stored in a first cell core of the cell core row, a second portion of the word-wide organized data is stored in a second cell core of the cell core row, a third portion of the word-wide organized data is stored in a third cell core of the cell core row and a remaining portion of the word-wide organized data is stored in a fourth cell core of the cell core row.

12. The method of claim 9, wherein combining the upper portion and lower portion of the word line select signal to form the unique word line signal per storage address comprises combining pair-wise one upper portion signal from the first decoding block and one lower portion signal from the second decoding block.

13. The method of claim 9, wherein the word line driver comprises separate units for decoding output signals from the first decoding block and the second decoding block and for driving word lines.

14. The method of claim 9, wherein the cell core select unit is configured to receive a half word select signal and selectively activate only one of the cell cores of the cell core row.

15. A computer program product for operating a static random access memory (SRAM) array, the computer program product comprising:
   a computer readable storage medium readable by a processing circuit and storing instructions for execution by the processing circuit for performing a method comprising:
      storing and retrieving word-wide organized data using multiple cell cores, wherein a cell core comprises a plurality of SRAM cells, and wherein at least two corresponding cell cores build a cell core row of the SRAM array, the SRAM array including at least two cell core rows, wherein the cell core row is configured to hold multiple storage words;
      decoding one or more incoming address signals representing a storage address into a single word line so that one storage word uniquely identified by the single word line is activated within the cell core row, the decoding comprising:
         generating a cell core row select signal of activating a decoding element uniquely corresponding to the cell core row based on input of a first part of the one or more incoming address signals and a received clock signal;
         using a first decoding block of the decoding element for receiving and decoding a second part of the one or more incoming address signals for building an upper portion of one or more word line select signals and using a second decoding block of the decoding element for receiving and decoding a third part of the one or more incoming address signals for building a lower portion of the one or more word line select signals; and
         combining the upper portion of a word line select signal, of the one or more word line select signals, from the first decoding block of the decoding element and the lower portion of the word line select signal from the second decoding block if the decoding element to form a unique word line signal per storage address.

16. The computer program product of claim 15, wherein the word-wide organized data are stored in two related cell cores building the cell core row, wherein one portion of the word-wide organized data is stored in a first cell core of the cell core row and a remaining portion of the word-wide organized data is stored in a corresponding second cell core of the cell core row.

17. The computer program product of claim 15, wherein the word-wide organized data are stored in four corresponding cell cores building the cell core row, wherein a first portion of the word-wide organized data is stored in a first cell core of the cell core row, a second portion of the word-wide organized data is stored in a second cell core of the cell core row, a third portion of the word-wide organized data is stored in a third cell core of the cell core row and a remaining portion of the word-wide organized data is stored in a fourth cell core of the cell core row.

18. The computer program product of claim 15, wherein the combining the upper portion and lower portion of the word line select signal to form the unique word line signal per storage address comprises combining pair-wise one upper portion signal from the first decoding block and one lower portion signal from the second decoding block.

* * * * *